United States Patent
Bindseil et al.

(10) Patent No.: US 10,393,837 B2
(45) Date of Patent: Aug. 27, 2019

(54) SYSTEM AND METHOD FOR MAGNETIC RESONANCE COIL ARRANGEMENT

(71) Applicants: Geron Andre Bindseil, Toronto (CA); Chad Tyler Harris, Toronto (CA); William Bradfield Handler, Toronto (CA); Blaine Alexander Chronik, Toronto (CA)

(72) Inventors: Geron Andre Bindseil, Toronto (CA); Chad Tyler Harris, Toronto (CA); William Bradfield Handler, Toronto (CA); Blaine Alexander Chronik, Toronto (CA)

( * ) Notice: Subject to any disclaimer, the term of this patent is extended or adjusted under 35 U.S.C. 154(b) by 130 days.

(21) Appl. No.: 15/544,162

(22) PCT Filed: Feb. 23, 2015

(86) PCT No.: PCT/CA2015/000108
§ 371 (c)(1),
(2) Date: Jul. 17, 2017

(87) PCT Pub. No.: WO2016/134438
PCT Pub. Date: Sep. 1, 2016

(65) Prior Publication Data
US 2018/0017644 A1    Jan. 18, 2018

(51) Int. Cl.
*G01R 33/44* (2006.01)
*G01R 33/38* (2006.01)
(Continued)

(52) U.S. Cl.
CPC ......... *G01R 33/443* (2013.01); *G01R 33/381* (2013.01); *G01R 33/3802* (2013.01);
(Continued)

(58) Field of Classification Search
CPC  G01R 33/443; G01R 33/3804; G01R 33/445; G01R 33/421; G01R 33/381; G01R 33/3802; G01R 33/385
See application file for complete search history.

(56) References Cited

U.S. PATENT DOCUMENTS

2011/0160564 A1* 6/2011 Alford ................ G01R 33/445
                                                        600/410
2011/0279117 A1   11/2011 Alford et al.
(Continued)

OTHER PUBLICATIONS

Alford et al. "An optimized insert coil for high-performance delta relaxation enhanced MR imaging of the mouse".
(Continued)

*Primary Examiner* — G. M. A Hyder
(74) *Attorney, Agent, or Firm* — Perry + Currier Inc.

(57) ABSTRACT

A magnetic resonance imaging (MRI) system is provided. The system includes a main field magnet generating a main magnetic field B0. Moreover, the system further includes an integrated magnet device. The integrated magnet device has field-shift shield coils and gradient coils. The MRI system further includes a removable insert comprising field-shift shield coils. At least one substrate layer is included in the integrated magnet device to provide mechanical support for the field-shift coils and the gradient coils. Moreover, a cooling mechanism is provided to cool at least some of the magnets.

18 Claims, 7 Drawing Sheets

(51) Int. Cl.
*G01R 33/381* (2006.01)
*G01R 33/421* (2006.01)
*G01R 33/385* (2006.01)

(52) U.S. Cl.
CPC ....... *G01R 33/3804* (2013.01); *G01R 33/421* (2013.01); *G01R 33/445* (2013.01); *G01R 33/385* (2013.01)

(56) References Cited

U.S. PATENT DOCUMENTS

| | | | |
|---|---|---|---|
| 2015/0293193 A1 | 10/2015 | Alford et al. | |
| 2016/0178718 A1* | 6/2016 | Bindseil | H01F 41/04 324/322 |
| 2017/0293005 A1* | 10/2017 | Panther | A61B 5/05 |
| 2018/0024211 A1* | 1/2018 | Bindseil | G01R 33/3802 324/322 |

OTHER PUBLICATIONS

Handler et al. "New Head Gradient Coil Design and Construction Techniques".
Handler et al., "Innovations in gradient coil construction" Journal of magnetic resonance imaging.
Harris et al., "Development and optimization of hardware for delta relaxation enhanced MRI".
Harris et al., "A practical insert design for dreMR imaging in the human head".
Alford et al., "Design and construction of a prototype high-power BO insert coil for field-cycled imaging in superconducting MRI systems".
Alford et al., "Delta relaxation enhanced MR: Improving activation-specificity of molecular probes through R1 dispersion imaging".
Araya, Yonathan, "Delta Relaxation Enhanced Magnetic Resonance—Development and Application of a Field-Cycling Contrast Mechanism" *pp. 29-32, Section 2.11. Section 21.1 * *Figures 2.1* *pp. 36-39, Figure 2.4, Section 2.2*.
International Search Report dated Nov. 23, 2015 for International Application No. PCT/CA2015/000108.
Written Opinion dated Nov. 23, 2015 for International Application No. PCT/CA2015/000108.
International Preliminary Report on Patentability dated Jun. 27, 2017 for U.S. Patent Application No. PCT/CA2015/000108.
Alford et al. "An optimized insert coil for high-performance delta relaxation enhanced MR imaging of the mouse" Proc. Intl. Soc. Mag. Reson. Med. 18 (2010), p. 1551.
Alford et al., "Delta relaxation enhanced MR: Improving activation-specificity of molecular probes through R1 dispersion imaging," Magnetic Resonance in Medicine 61:796-802 (2009).
Alford et al., "Design and construction of a prototype high-power BO insert coil for field-cycled imaging in superconducting MRI systems," Concepts in Magnetic Resonance Part B (Magnetic Resonance Engineering) DOI 10.1002/cmr.b, pp. 1-10.
Araya, Yonathan, "Delta Relaxation Enhanced Magnetic Resonance—Development and Application of a Field-Cycling Contrast Mechanism" Electronic Thesis and Dissertation Repository. Paper 1242.
Handler et al. "New Head Gradient Coil Design and Construction Techniques" J. Magn Reson Imaging. Author manuscript; available in PMC 2015, May 1, 2015.
Handler et al., "Innovations in gradient coil construction" Journal of magnetic resonance imaging, Proc. Intl. Soc. Mag. Reson. Med. 19 (2011), p. 1834.
Harris et al., "A practical insert design for dreMR imaging in the human head," Proc. Intl. Soc. Mag. Reson. Med. 19 (2011), p. 1839.
Harris et al., "Development and optimization of hardware for delta relaxation enhanced MRI," Magnetic Resonance in Medicine. Jan. 1. 2013, pp. 1182-1191.

* cited by examiner

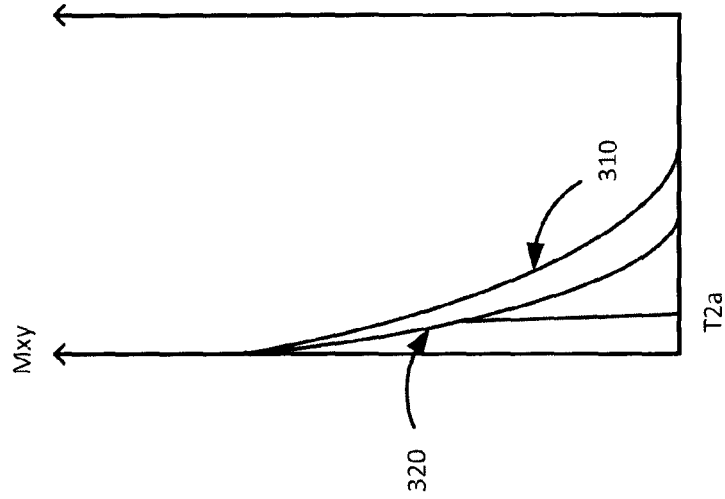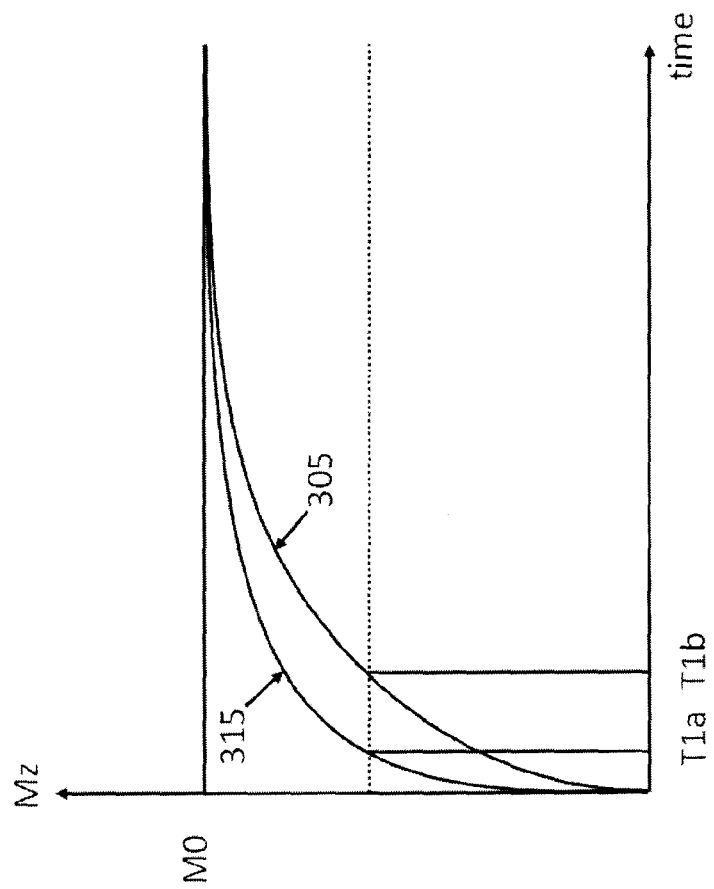
FIG. 3

SYSTEM AND METHOD FOR MAGNETIC RESONANCE COIL ARRANGEMENT

FIELD OF THE INVENTION

The present invention relates generally to magnetic resonance imaging. More specifically, the present invention relates to an arrangement of coils for increasing signal detection sensitivity of a magnetic resonance imaging system.

BACKGROUND OF THE INVENTION

Magnetic resonance imaging (MRI) is a major imaging technique used in medicine. MRI is capable of generating detailed images of soft tissues such as the brain, muscles and kidneys. Specific properties of the various compounds found inside tissues, such as water and/or fat, are used to generate images. When subjected to a strong magnetic field, the vector sum of the nuclear magnetic moments of a large number of atoms possessing a nuclear spin angular momentum, such as hydrogen, which is abundant in water and fat, will produce a net magnetic moment in alignment with the externally applied field. The resultant net magnetic moment can furthermore precess with a well-defined frequency that is proportional to the applied magnetic field. After excitation by radio frequency pulses, the net magnetization will generate a signal that can be detected.

Delta relaxation enhanced magnetic resonance (DREMR) generally referred to as field-cycled relaxometry or field-cycled imaging is an MRI technique that offers the possibility of using underlying tissue contrast mechanism which vary with the strength of the applied magnetic field to generate novel image contrasts. To achieve DREMR contrast, the main magnetic field is varied as a function of time during specific portions of an MR pulse sequence. A field-shifting electromagnet coil is used to perform the field variation. Proper arrangement of the field-shifting electromagnet with the traditional MRI coils used in a DREMR system is important since the contrast mechanism for DREMR is highly correlated with the strength of the magnetic field shifts produced.

SUMMARY OF THE INVENTION

It is an object to provide a novel system and method for an MRI scanning system and method that obviates and mitigates at least one of the above-identified disadvantages of the prior art.

According to one aspect, an integrated magnet device for use in a magnetic resonance imaging (MRI) system is provided. The system includes a main field magnet generating a main magnetic field B0. Moreover, the system further includes an integrated magnet device. The integrated magnet device can have field-shift shield coils and gradient coils. The MRI system further includes a removable insert comprising field-shift shield coils. At least one substrate layer is included in the integrated magnet device to provide mechanical support for the field-shift coils and the gradient coils. Moreover, a cooling mechanism is provided to cool at least some of the magnets. The integrated magnet device can also include at least one cooling mechanism.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 3 shows illustrative examples of T1 and T2 relaxation diagrams;

DETAILED DESCRIPTION

Figure 1:
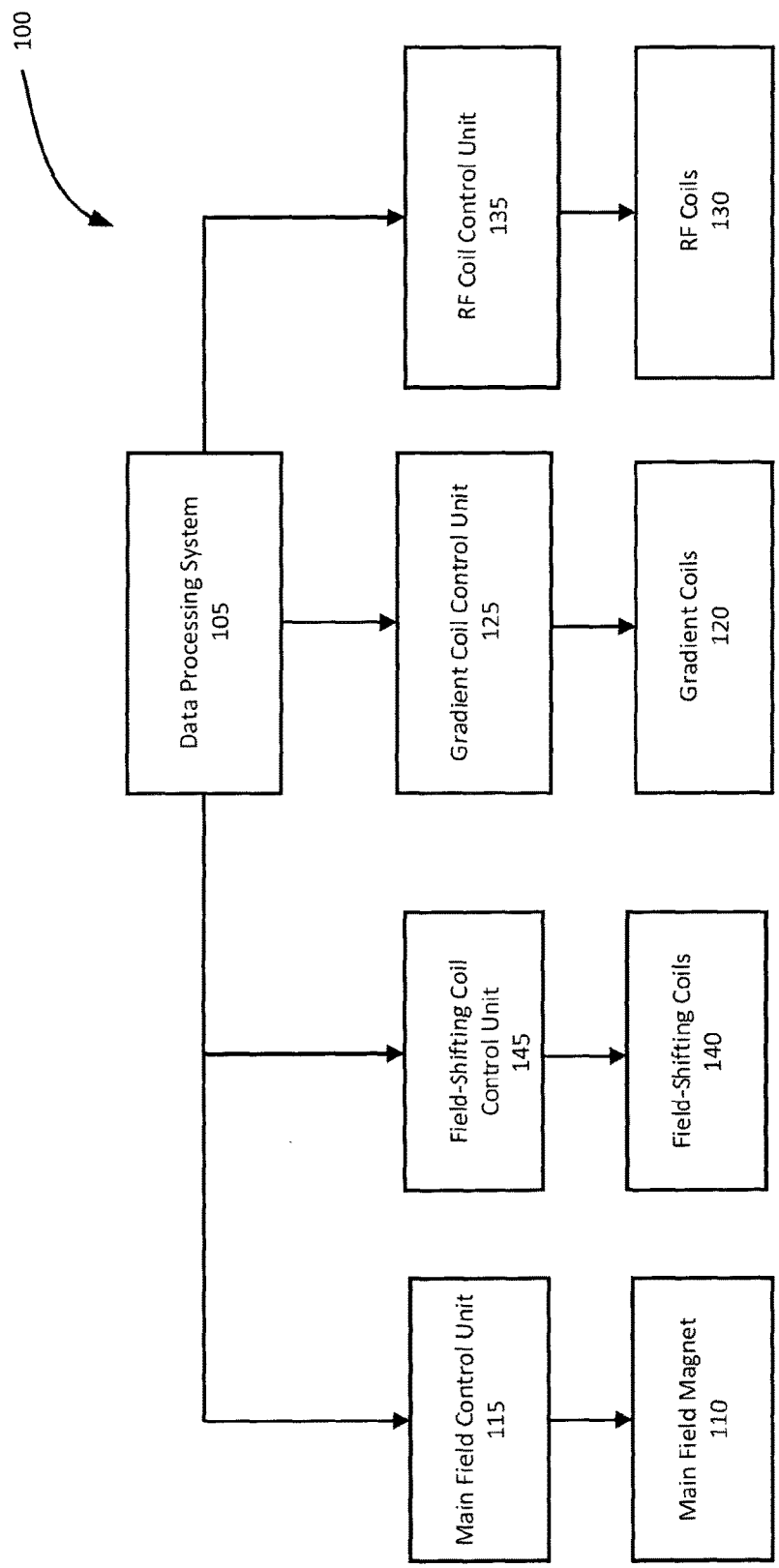
FIG. 1 shows a block diagram of the functional subsystems of a delta relaxation magnetic resonance imaging system in accordance with an implementation.

Referring to FIG. 1, a block diagram of a delta relaxation magnetic resonance imaging (DREMR) system, in accordance with an example implementation, is shown at 100. The example implementation of the DREMR system indicated at 100 is for illustrative purposes only, and variations including additional, fewer and/or varied components are possible. Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues. DREMR systems use field-shifting magnetic resonance methods in conjunction with traditional MRI techniques to obtain images with different contrast than is possible with traditional MRI, including molecularly-specific contrast.

As shown in FIG. 1, the illustrative DREMR system 100 comprises a data processing system 105. The data processing system 105 can generally include one or more output devices such as a display, one or more input devices such as a keyboard and a mouse as well as one or more processors connected to a memory having volatile and persistent components. The data processing system 105 can further comprise one or more interfaces adapted for communication and data exchange with the hardware components of MRI system 100 used for performing a scan.

Continuing with FIG. 1, the example DREMR system 100 can also include a main field magnet 110. The main field magnet 110 can be implemented as a permanent, superconducting or a resistive magnet, for example. Other magnet types, including hybrid magnets suitable for use in the DREMR system 100 will now occur to a person of skill and are contemplated. The main field magnet 110 is operable to produce a substantially uniform main magnetic field having a strength B0 and a direction along an axis. The main magnetic field is used to create an imaging volume within which desired atomic nuclei, such as the protons in Hydrogen within water and fat, of an object are magnetically aligned in preparation for a scan. In some implementations, as in this example implementation, a main field control unit 115, in communication with data processing system 105, can be used for controlling the operation of the main field magnet 110.

The DREMR system 100 can further include gradient magnets, for example the gradient coils 120, used for encoding spatial information in the main magnetic field along, for example, three perpendicular gradient axis. The size and configuration of the gradient coils 120 can be such that they produce a controlled and uniform linear gradient. For example, three paired orthogonal current-carrying primary coils located within the main field magnet 110 can be designed to produce the desired linear-gradient magnetic fields.

In some implementations, the gradient coils 120 may be shielded and include an outer layer of shield magnets, for example coils, which can produce a magnetic field to counter the gradient magnetic field produced by the primary gradient coils, thus forming a primary-shield coils pair. In such a coil pair, the "primary" coils can be responsible for creating the gradient field. The "shield" coils, on the other hand, can be responsible for reducing stray fields caused by the primary coils outside of a certain volume, such as an imaging volume. In some implementations, the primary and shield gradient coils 120 may be connected in series. In further implementations, it is also possible to have more than two layers of coils for any given gradient axis that together form a shielded gradient coil 120. The shielded gradient coils 120 may reduce eddy currents and other interference which can cause artefacts in the scanned images. Since eddy currents mainly flow in conducting components of the DREMR system 100 and are caused by magnetic fields outside of the imaging volume (fringe fields), reducing the fringe fields produced by the gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils can be arranged in the form of concentric cylinders whereas for vertical field magnets, the two coils may be arranged in coaxial disks.

One side effect of shielding can be that the fields produced by the primary-shield coils pair of the gradient coils 120 may partially cancel each other within the imaging volume. Accordingly, more current can be required to produce a gradient field with a particular strength by shielded gradient coils 120 than by unshielded gradient coils 120. This effect can be quantified as the gradient efficiency, which may be defined as the achievable gradient strength for 1 Ampere of driving current. Another important parameter describing gradient coil performance is called the gradient slew rate, which is the rate of driving a gradient coil from zero to its maximum amplitude. This term is inversely proportional to the inductance of the gradient coil. Typically, in order to increase the efficiency of a shielded gradient coils 120 to be comparable to the efficiency of an unshielded gradient coils 120 the inductance must increase. This increase in inductance will decrease the maximum achievable slew rate. The loss in efficiency for a shielded configuration can depend on the distance and current density ratio between the primary and shield coils. Increasing the distance between the primary-shield coils pair may increase the efficiency.

The conductive components of the gradient coils 120, whether shielded or unshielded and including the primary and shield coils, may consist of an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils can be insulated by physical separation and/or a non-conductive barrier. The primary gradient windings can be placed, for example, on a non-conductive substrate (for example, G10, FR4, epoxy or others).

In some variations, the gradient coils 120 may also be provided with thermal control or heat extraction mechanisms. For example, some of the windings can be hollow and coolant can be passed through these hollow conductors to extract heat from the gradient coils 120, produced, for instance, by resistive heating of the windings when electricity is applied. Alternatively, other methods of extracting heat can be used, such as inserting coolant channels within the gradient coils 120. The coolant channels can be in thermal contact with the gradient coil windings. The gradient coils 120 can also be mounted in a thermally-conductive but electrically-non-conductive epoxy to ensure that the mechanical assembly is rigid and to limit the possibility of electrical breakdown.

The magnetic fields produced by the gradient coils 120, in combination and/or sequentially, can be superimposed on the main magnetic field such that selective spatial excitation of objects within the imaging volume can occur. In addition to allowing spatial excitation, the gradient coils 120 can attach spatially specific frequency and phase information to the atomic nuclei placed within the imaging volume, allowing the resultant MR signal to be reconstructed into a useful image. The gradient coil control unit 125 in communication with the data processing system 105 can be used to control the operation of the gradient coils 120.

In some implementations of the DREMR system 100, there may be additional electromagnet coils present, such as shim coils (traditionally, but not limited to, producing magnetic field profiles of 2nd order or higher spherical harmonics) or a uniform field offset coil or any other corrective electromagnet. To perform active shimming (correcting the field distortions that are introduced when different objects are placed within or around the system), the corrective electromagnets, such as the shim coils, carry a current that is used to provide magnetic fields that act to make the main magnetic field more uniform. For example, the fields produced by these coils can aid in the correction of inhomogeneities in the main magnetic field due to imperfections in the main magnet 110, or due to the presence of external ferromagnetic objects, or due to susceptibility differences of materials within the imaging region, or any other static or time-varying phenomena.

The DREMR system 100 can further comprise radio frequency (RF) coils 130. The RF coils 130 are used to establish an RF magnetic field with a strength B1 to excite the atomic nuclei or "spins". The RF coils 130 can also detect signals emitted from the "relaxing" spins within the object being imaged. Accordingly, the RF coils 130 can be in the form of separate transmit and receive coils or a combined transmit and receive coil with a switching mechanism for switching between transmit and receive modes.

The RF coils 130 can be implemented as surface coils, which are typically receive only coils and/or volume coils which can be receive and transmit coils. The RF coils 130 can be integrated in the main field magnet 110 bore. Alternatively, the RF coils 130 can be implemented in closer proximity to the object to be scanned, such as a head, and can take a shape that approximates the shape of the object, such as a close-fitting helmet. An RF coil control unit 135 in communication with the data processing system 100 can be used to control the operation of the RF coils 130.

To create a contrast image in accordance with field-shifting techniques, DREMR system 100 can use field-shifting electromagnets 140 while generating and obtaining MR signals. The field-shifting electromagnets 140 can modulate the strength of the main magnetic field. Accordingly, the field-shifting electromagnets 140 can act as auxiliary to the main field magnet 110 by producing a field-shifting magnetic field that augments or perturbs the main magnetic field. A field-shifting electromagnet control unit 145 in communication with the data processing system 100 can be used to control the operation of the field-shifting electromagnets 140.

To reduce interference and artefacts, the field-shifting electromagnets 140 may include a shield similar to the shielded gradient coils 120 described above. The shielded field-shifting electromagnets 140 can have two components: an inner "primary" field-shifting electromagnets, to produce the field shift and an outer "shield" field-shifting electromagnets, to form a shield by reducing the stray field of the primary field-shifting electromagnets outside a certain volume such as an imaging volume. Implementing field-shifting primary and shield electromagnets combination that balances the competing needs of low inductance (faster slew rates), high efficiency (greater magnetic field strength for a given current amplitude), and low resistance (less heating and subsequent demands on cooling) is a complex electromagnetic problem.

Indeed, one side effect of shielding the field-shifting electromagnets 140 can be that the fields produced by the primary and shield components of the shielded field-shifting electromagnets 140 may partially cancel each other within the imaging volume. Accordingly, more current can be required to produce a magnetic field with a particular strength by shielded field-shifting electromagnets 140 than by unshielded field-shifting electromagnets 140. This effect can be quantified as the field-shift efficiency, which may be defined as the field-shift amplitude per 1 Ampere of current passing through the electromagnet. The loss in efficiency for a shielded configuration depends on the distance and current density ratio between the shield electromagnets and the primary electromagnets. Increasing the distance between the primary and shield electromagnets may increase the field-shift efficiency.

The conductive components of the field-shifting electromagnets 140, including the primary and shield electromagnets, may consist of an electrical conductor (for example copper, aluminum, etc.). The internal electrical connections can be such that when a voltage difference is applied to the terminals of the field-shifting electromagnets 140, electric current can flow in the desired path. The conductive components for both the primary and the shield electromagnets can be insulated by physical separation and/or a non-conductive barrier. The field-shift windings can be placed in layers on or within a non-conductive substrate (for example, G10, FR4, epoxy or others).

In some variations, the field-shifting electromagnets 140 may also be provided with thermal control or heat extraction mechanisms. For example, where windings are used to form the electromagnets, the windings can be hollow and coolant can be passed through these hollow conductors to extract heat deposited in the electromagnet due to resistive heating of the windings when electricity is applied. Alternatively, other methods of extracting heat can be used, such as inserting coolant channels within the field-shifting electromagnets 140. The coolant channels can be in thermal contact with the field-shifting electromagnets 140. The field-shifting electromagnets 140 can also be mounted in a thermally-conductive but electrically-non-conductive epoxy to ensure that the mechanical assembly is rigid and to limit the possibility of electrical breakdown.

There are many techniques for obtaining images using the DREMR system 100, including T1 and T2 weighted images. To provide a simplified illustration of the DREMR system 100's functionality, simplified operations for obtaining proton density-weighted images are described as a non-limiting example. To create an image in accordance with the example illustration, the DREMR system 100 detects the presence of atomic nuclei containing spin angular momentum in an object, such as those of Hydrogen protons in water or fat found in tissues, by subjecting the object to a relatively large magnetic field. In this example implementation, the main magnetic field has a strength of B0 and the atomic nuclei containing spin angular momentum may be Hydrogen protons or simply protons. The main magnetic field partially polarizes the Hydrogen protons in the object placed in the imaging volume of the main magnet 110. The protons are then excited with appropriately tuned RF radiation, forming an RF magnetic field with a strength of B1, for example. Finally, weak RF radiation signal from the excited protons is detected as an MR signal, as the protons "relax" from the magnetic interaction. The frequency of the detected MR signal is proportional to the magnetic field to which they are subjected. Cross-sections of the object from which to obtain signals can be selected by producing a magnetic field gradient across the object so that magnetic field values of the main magnetic field can be varied along various locations in the object. Given that the signal frequency is proportional to the varied magnetic field created, the variations allow assigning a particular signal frequency and phase to a location in the object. Accordingly, sufficient information can be found in the obtained MR signals to construct a map of the object in terms of proton presence, which is the basis of a traditional MRI image. For example, since proton density varies with the type of tissue, tissue variations can be mapped as image contrast variations after the obtained signals are processed.

Figure 2:
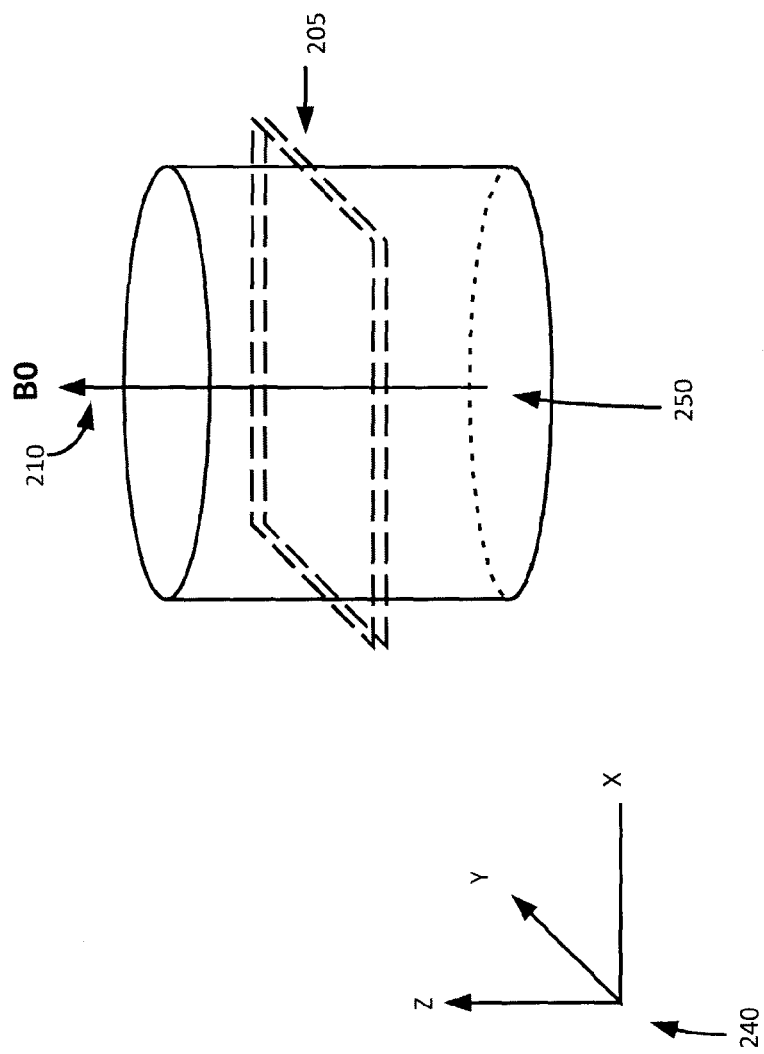
FIG. 2 shows an imaging volume and corresponding slice to be scanned by the delta relaxation magnetic resonance system of FIG. 1 in accordance with an implementation.

Referring now to FIG. 2, to further illustrate the example signal acquisition process by the DREMR system 100, it will be assumed that an object is placed within an imaging volume 250 of the main magnet 110 having a main magnetic field 210 with a strength B0, pointing along the Z-axis indicated at 240. The object subsequently has a net magnetization vector. In this illustrative example, a slice in a plane along the X and Y axes, as indicated at 205, is being imaged. It should be noted that in this example, the slice has a finite thickness along the Z-axis, creating a volumetric slice 205.

When the object is placed in the main magnetic field B0, the individual spins align themselves in the direction of the Z-axis. Referring to FIG. 3, at equilibrium, the magnetization by main field B0 can produce a net longitudinal magnetization Mz, with an amplitude of M0, parallel with the main magnetic field. Excitation of the spins may be achieved when a radio frequency (RF) pulse that generates the RF magnetic field with an amplitude of B1 is applied at the Larmor frequency, by the RF coils 130. During the application of the RF magnetic field the net magnetization rotates around the applied RF (B1) field and can cause the net magnetization to rotate away from the Z-axis. The component of the rotated magnetization that is projected in the X-Y plane is the net transverse magnetization Mxy. The spins can precess about the applied RF magnetic field until the RF magnetic field is removed.

Once the equilibrium magnetization is perturbed, spin-relaxation processes occur. Spin-lattice relaxation processes cause a return of magnetization to the equilibrium distribution along the Z-axis. Spin-lattice relaxation can thus bring the longitudinal magnetization Mz back toward its maximum value MO, as indicated at 305, with a characteristic time constant T1. A characteristic time representing the recovery of the magnetization along the Z-axis by 37% is called the T1 relaxation time or T1 time. 1/T1 is referred to as the longitudinal relaxation rate.

Spin-spin relaxation, on the other hand, can cause a loss of coherence due to dephasing of the net transverse magnetization. Therefore, during spin-spin relaxation, the transverse magnetization Mxy exponentially decays toward zero, as indicated at 310, with a characteristic time constant T2. A characteristic time representing the decay of the signal by 37%, is called the T2 relaxation time or T2 time. 1/T2 is referred to as the transverse relaxation rate.

Transverse relaxation (T2) can cause irreversible dephasing of the transverse magnetization. There is also a reversible dephasing effect caused by magnetic field inhomogeneities. These additional dephasing fields may arise from a variety of sources including the main magnetic field inhomogeneity, the differences in magnetic susceptibility among various tissues or materials, chemical shift, and gradients applied for spatial encoding. The contribution to the transverse relaxation time from these reversible dephasing effects are typically referred to as T2'. The characteristic relaxation time of the combination of reversible (T2') and irreversible (T2) dephasing effects is typically referred to as T2* relaxation.

The difference between the time constants T1 and T2 are important for development of contrast in MR imaging. The relaxation times can vary with the strength of the magnetic field applied, as well as temperature. Moreover, T1 and T2 values associated with biological tissues can vary. Generally, tissues with shorter T1 times, such as T1$a$ as indicated at 315, can yield greater signal intensity at a given point in time (appearing brighter in images) than those with longer T1 times, such as T1$b$ as indicated at 305, due to the more rapid recovery of signal. On the other hand, tissues possessing short T2 times, such as T2$a$ as indicated at 320, can yield lower signal intensity (appearing darker in images) due to a reduction in the detected transverse magnetization Mxy. The MR signal from an image can be therefore dependent on the combination of the intrinsic tissue properties and extrinsic user-selected imaging parameters and contrast agents.

To obtain images from the DREMR system 100 in the traditional manner, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

The sequence of RF pulses and gradient waveforms, namely the type of pulse sequence, applied may change which relaxation times have the most influence on the image characteristics. For example, T2* relaxation has a significant influence following a 90° RF pulse which is used in a gradient-echo (GRE) sequence, whereas T2 relaxation has a more significant influence following 90°-180° sequential RF pulses (also known as a spin echo sequence).

Figure 4:
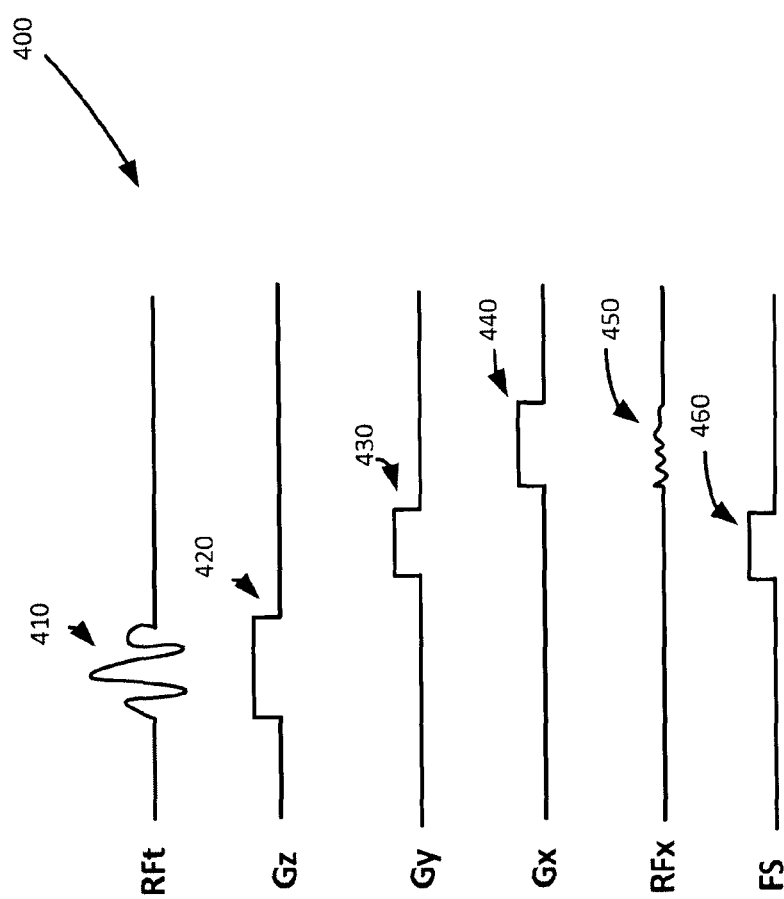
FIG. 4 shows an example pulse sequence in accordance with an implementation.

Referring now to FIG. 4, an illustrative pulse sequence 400 is shown that can be used to acquire images using the DREMR system 100. Specifically, a timing diagram for the example pulse sequence is indicated. The timing diagram shows pulse or signal magnitudes, as a function of time, for transmitted (RFt) signal, magnetic field gradients $G_x$, $G_y$, and $G_z$, received RFx signal and filed-shifting signal (FS). An idealized pulse sequence, simplified for illustrative purposes, can contain a slice selection radio frequency pulse 410 at RFt, a slice selection gradient pulse 420 at Gz, a phase encoding gradient pulse 430 at Gy, a frequency encoding gradient pulse 440 at Gx, as well as a detected MR signal 450 at RFx. The pulses for the three gradients Gx, Gy, and Gz represent the magnitude and duration of the magnetic field gradients that can be generated by the gradient coils 120. The slice selection pulse 410 can be generated by the transmit aspect of RF coils 130. Detected MR signal 450 can be detected by the receive aspect of the RF coils 130. In this illustrative example it will be assumed that transmit aspect and receive aspect of RF coils 130 are formed by distinct coils. Finally, the field-shifting signal FS causes the main magnetic field strength to be changed for the duration of the signal FS. The precise timing, amplitude, shape and duration of the pulses or signals may vary for different imaging techniques. For example, field-shifting signal FS may be applied at a time and manner that allows image contrast to increase for the technique used.

The first event to occur in pulse sequence 400 can be to turn on the slice selection gradient pulse 420. The slice selection RF pulse 410 can be applied at the same time. In this illustrative example, the slice selection RF pulse 410 can be a sin c function shaped burst of RF energy. In other implementations, other RF pulse shapes and durations can be used. Once the slice selection RF pulse 410 is turned off, the slice selection gradient pulse 420 can also be turned off and a phase encoding gradient pulse 430 can be turned on. In some implementations, the field-shifting signal 460 may also be turned on at this point to change the main magnetic field strength. Once the phase encoding gradient pulse 430 is turned off, a frequency encoding gradient pulse 440 can be turned on and a detected MR signal 450 can be recorded. It should be noted that the shapes, magnitudes and durations of the pulses and signals shown in FIG. 4 are chosen for illustrative purposes, and that in implementations, one or more of these factors and others may be varied to achieve the desired scan results.

The pulse sequence 400 can be repeated a certain number of times or iterations, typically 256 times, to collect all the data needed to produce one image. The time between each repetition of the pulse sequence 400 can be referred to as the repetition time (TR). Moreover, the duration between the center point of the slice selection pulse 410 and the peak of detected MR signal 450 can be referred to as echo time (TE). Both TR and TE can be varied as appropriate for a desired scan.

To further illustrate the signal acquisition process of DREMR system 100, FIG. 2 is referred to in conjunction with FIG. 4. To select a slice, the slice selection gradient pulse 420 can be applied along the Z-axis, satisfying the resonance condition for the protons located in the slice 205. Indeed, the location of the slice along the Z-axis can be determined based in part on the slice selective gradient pulse 420. Accordingly, the slice selection pulse 410, generated at the same time as the slice selection gradient pulse 420 can excite protons that are located within the slice 205 in this example. Protons located above and below the slice 205 are typically not affected by the slice selection pulse 410.

Continuing with the illustrative example, in accordance with the pulse sequence 400, a phase encoding gradient pulse 430 can be applied after the slice selection gradient pulse 420. Assuming this is applied along the Y-axis, the spins at different locations along the Y-axis can begin to precess at different Larmor frequencies. When the phase encoding gradient pulse 420 is turned off, the net magnetization vectors at different locations can precess at the same rate, but possess different phases. The phases can be determined by the duration and magnitude of the phase encoding gradient pulse 430.

Once the phase encoding gradient pulse 430 is turned off, a frequency encoding gradient pulse 440 can be turned on. In this example the frequency encoding gradient is in the X direction. The frequency encoding gradient can cause protons in the selected slice to precess at rates dependent on their X location. Accordingly, different spatial locations within the slice are now characterized by unique phase angles and precessional frequencies. RF receive coils 130 can be used to receive the detected signal 450 generated by the protons contained in the object being scanned while the frequency encoding gradient pulse 440 is turned on.

Figure 5:
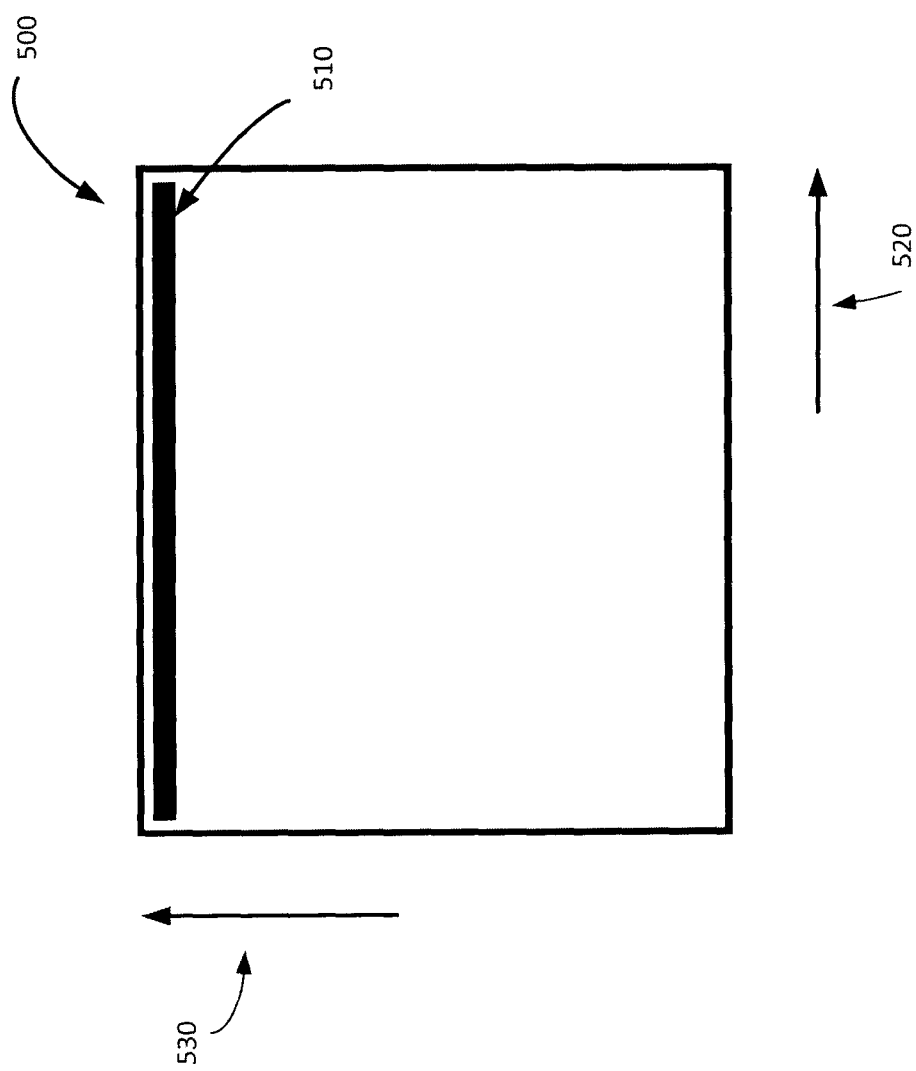
FIG. 5 shows a schematic representation of a k-space containing one received line in accordance with an implementation.

As the pulse sequence 400 is performed by DREMR system 100, the acquired signals can be stored in a temporary matrix referred to as k-space, as shown in FIG. 5 at 500. Typically, k-space is the collection of the detected signals measured for a scan and is in the spatial frequency domain. K-space can be covered by frequency encoding data along the X-axis 520 (Kx) and phase encoding data along the Y-axis 530 (Ky). When all the lines for the k-space matrix for a slice are received (at the end of the scan of a single slice, for example) the data can be mathematically processed, for example through a two-dimensional Fourier-transform, to produce a final image. Thus, k-space can hold raw data before reconstruction of the image into the spatial domain. Typically, k-space has the same number of rows and columns as the final image and is filled with raw data during the scan, usually one line per pulse sequence 400. For example, the first line of k-space 500, indicated at 510, is filled after the completion of the first iteration of the pulse sequence generated for scanning a slice and contains the detected signal for that pulse sequence iteration. After multiple iterations of the pulse sequence, the k-space can be filled. Each iteration of the pulse sequence may be varied slightly, so that signals for the appropriate portions of the k-space are acquired. It should be noted that based on different pulse sequences, other methods of filling the k-space are possible, such as in a spiral manner, and are contemplated.

The gradient coils 120 produce time-varying magnetic fields with a specific spatial distribution and are a typical component of MRI systems. Greater field-variation magnitudes enable faster MR imaging sequences and increased resolution. As discussed above, the maximum achievable gradient strength is characterized by the gradient efficiency. The efficiency of the gradient coils 120 can be improved through variations in the shape, size and placement of the gradient coils 120. For example, in a cylindrical implementation the primary gradient coil windings may be built at a smaller radius closer to the object in the imaging volume. Alternatively, the number of wires (winding density) can be increased.

Similar considerations apply to the field-shifting electromagnets 140. The field-shifting electromagnets 140 produce time-varying magnetic fields that can augment the main magnetic field produced by the main magnet 110. Greater magnitude of the field variation can enable increased performance. As discussed above, the maximum achievable field-shifting amplitude is characterized by the field-shifting efficiency. The efficiency of the field-shifting electromagnets 140 can be improved through variations in the shape, size and placement of the field-shifting electromagnets 140. For example, the primary field-shifting coils may be built at a smaller radius closer to the object placed in the imaging volume. Alternatively, the number of wires (winding density) can be increased.

Greater absolute field shifts produced by the field-shifting electromagnets 140 generally translate into greater contrast-to-noise ratio for delta relaxation enhanced MR signals, as well as greater flexibility in pulse sequences performed by the DREMR system 100. Therefore, being able to produce the greatest field-shift for a given power input by increasing the filed-shifting efficiency of the field-shifting electromagnets 140, can be highly desirable when implementing the DREMR system 100. Typically, to achieve higher efficiency, the primary field-shifting coils may be placed as close as possible to the object being imaged and the field-shifting shield coils may be placed as far as possible from the primary field-shifting coils. This principle typically also applies to the efficiency of shielded gradient coils 120. In some implementations, to achieve the magnitude of field shifts desired, improving the field-shifting efficiency can be prioritized over the gradient coil efficiency.

Combining field-shifting electromagnets 140 in the same mechanical assembly as the gradient coils 120 may enable increasing field-shifting efficiency within a given radial space. In some implementations, the primary and the shield coils of the gradient-coils 120 may be combined with the primary and shield coils of the field-shifting electromagnets 140 to form a single integrated magnet device with a layer placement that optimizes field-shifting efficiency.

Figure 6:
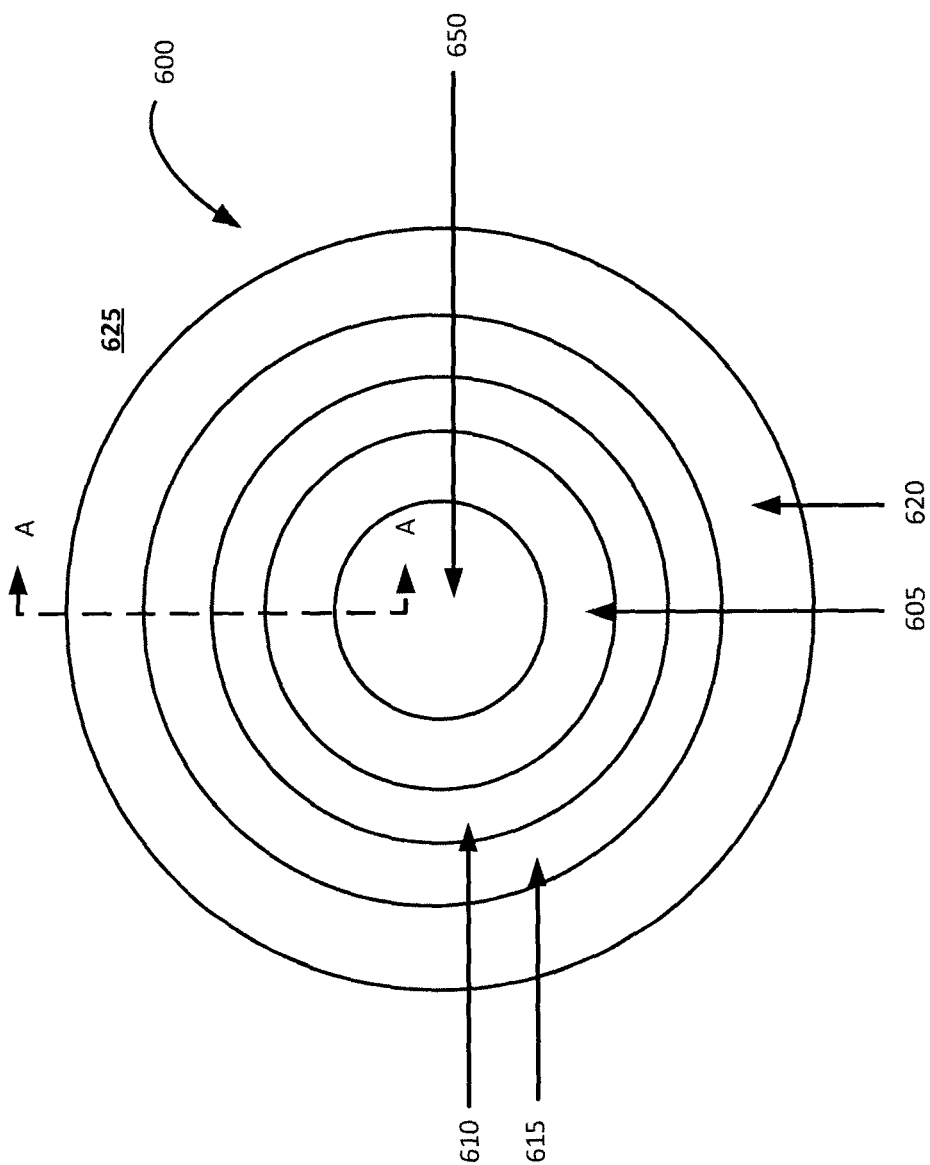
FIG. 6 shows an idealized radial cross-section of an example integrated magnet device in accordance with an implementation.

Cross section of an example cylindrical implementation for the integrated magnet device 600 is indicated in FIG. 6, in a simplified non-limiting manner for illustrative purposes. The elements shown in FIG. 6 are not to scale. The integrated magnet device of this example has a cylindrical shape whose length runs in a plane perpendicular to the plane of the figure. In other implementations, other shapes are possible, as long as the ordering of the layers is preserved. In further variations, the ordering may change as well. The integrated magnet device 600 of this example may surround an imaging volume 650, and may include primary field-shifting magnets 605, primary gradient magnets 610, gradient shield magnets 615 and field-shifting shield magnets 620. The integrated device is shown within the bore of the magnet 110, indicated at 625. Moreover, RF coils 130 and other magnets or coils such as shim coils may also be placed within imaging volume 650. It should be noted that typically primary field-shifting magnets 605 and field-shifting shielding magnets 620 can be used to produce a field-shifting magnetic field along the Z-axis, augmenting the main magnetic field by a predetermined amount dB. In FIG. 6, the Z-axis is perpendicular to the plane of the figure. Accordingly, primary field-shifting magnets 605 and field-shifting shielding magnets 620 can include appropriate windings to produce a field-shifting magnetic field along the Z-axis. Gradient primary magnets 610 and gradient-shielding magnets 615, on the other hand can produce fields that vary along all three orthogonal axis X, Y (located in the plane of the figure) and Z, and thus can include windings appropriate for generating and shielding gradient fields along these directions.

Based on the layer placement indicated at FIG. 6, the primary magnets 605 of the field-shifting electromagnets 140 can be placed as close as possible to the object being scanned while the field-shifting shield magnets 620 can be placed farther away from the primary magnets 605 of the field-shifting electromagnet 140, increasing the field-shifting efficiency. Moreover, field-shifting efficiency is prioritized over gradient efficiency by placing the gradient coils 120 between the primary field-shifting magnets 605 and field-shifting shield magnets 620 of the field-shifting electromagnets 140. Additional field-shifting electromagnet 140 layers may be inserted between the innermost primary electromagnet layer 605 and outermost shield electromagnet layer 620 of the field-shifting electromagnet, for example in order to increase the efficiency of the field shifting electromagnet 140 or as part of the field-shifting shield magnet. It should be noted that this layer placement is applicable to differently sized DREMR systems 100 such as DREMR systems 100 scaled for both small animal and human use.

Thermal power dissipation for gradient coils 120 and field-shifting magnets 140 can be managed by active and passive cooling. Heat can be extracted directly by using conductors having a hollow channel through which coolant is passed, or indirectly by passing coolant through the magnet or coil assembly in a manner such that the coolant is in thermal contact with the windings, or in any other way that is capable of extracting heat energy at the same average rate that resistive power is being dissipated by the electromagnets. Efficiencies can be gained when a cooling layer is in thermal contact with multiple coil components. The same cooling layers can be used to cool the gradient coils and their shields as well as the field-shifting primary and shield coils, making better use of the available radial space.

Figure 7:
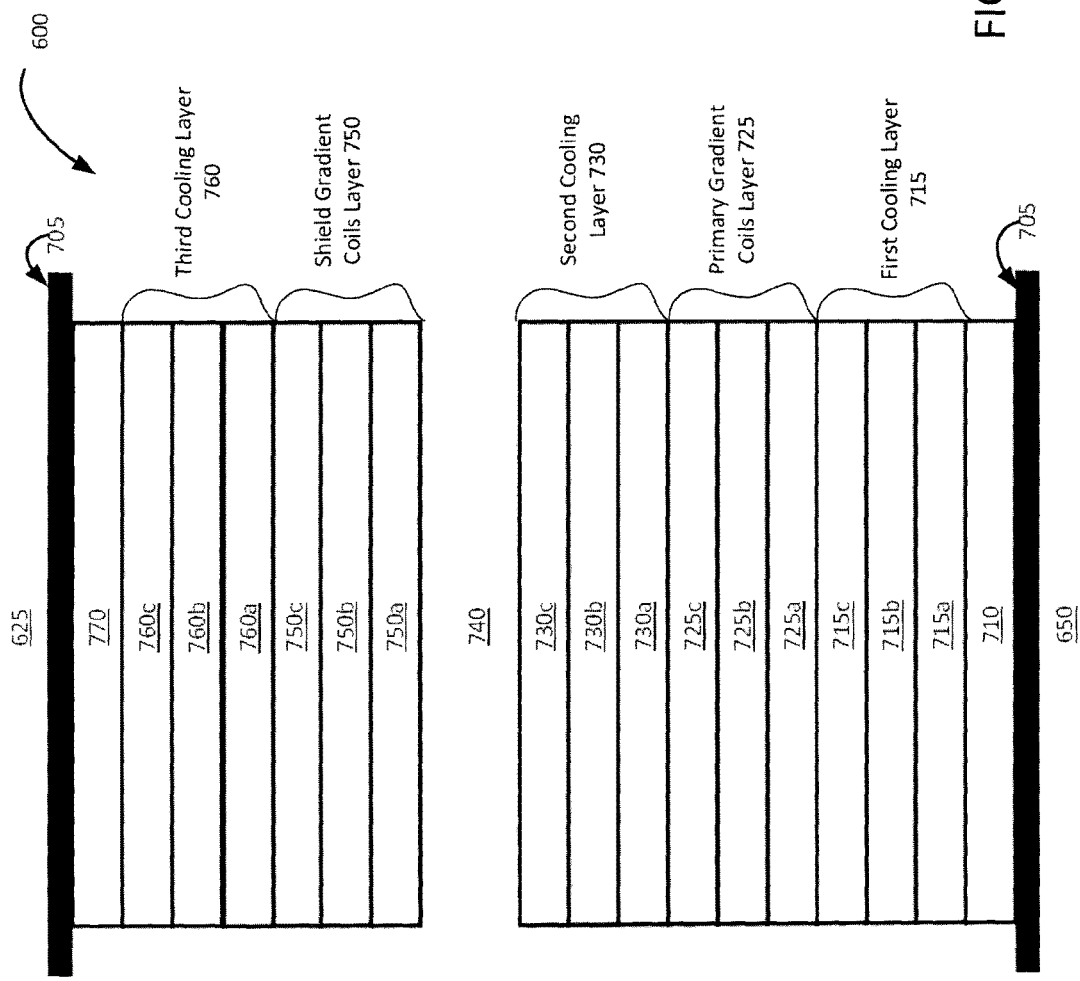
FIG. 7 shows idealized longitudinal cross-section of an example integrated magnet device in accordance with an implementation.

Referring to FIG. 7, a simplified illustrative cross section of an example integrated magnet device 600 in accordance with the layer placement indicated at FIG. 6 along A-A. It should be noted that the components shown are not to scale but have been sized for ease of illustration. The example integrated magnet device, as discussed above, includes the shielded field-shifting electromagnets 140, the shielded gradient coils 120 and passive and active cooling. Reference 650 indicates the imaging volume into which the object to be scanned would be placed. Moreover, RF coils 130 and other coils such as shim coils may also be placed within this space. Reference 625, on the other hand, indicates the bore of the main magnet 110 within which the integrated magnet device is located.

Continuing with FIG. 7, substrate layers are indicated at 705. The substrate layers can be formed of any rigid or semi-rigid material which can provide mechanical support for the field-shifting electromagnets 140. For example, the substrate 705 can be formed of G10, FR4 or epoxy. Primary field-shifting magnets of the field-shifting electromagnet 140 are indicated at 710. The primary field-shifting magnets 710 can be placed on and/or in the substrate 705 and form a magnet that produces the field-shifting magnetic field when activated. The primary field-shifting magnets 710 can be formed of windings made from electrically conductive materials suitable for magnetic field generation such as copper. The electrically conductive materials used are typically insulated to prevent short circuits within the windings as well as with other nearby electrically conductive components.

Thermally conductive sub-layers 715a and 715c as well as a coolant sub-layer 715b form a first cooling layer 715. The thermally conductive sub-layers 715a and 715c can be formed of any thermally conductive materials such as copper, aluminum, steel (typically uninsulated) or thermally conductive epoxy. The coolant sub-layer 715b may be composed of any mechanisms which would allow a coolant in the form of a liquid such as water or a glycol mixture or gas such as air to be circulated about the primary field-shifting windings 710 and the primary windings of the gradient coils 120, which are discussed further below. For example, hundreds of thin coolant tubes running the length of the primary field-shifting magnets 710 may be used to circulate the liquid coolant. In a variation, the coolant tubes may run around the circumference of the primary field-shifting magnets 710. Typically, the coolant mechanism used to distribute a coolant in the coolant layer 715b is not electrically conductive. For example, the coolant tubes may be constructed from non-conductive material, or may be rendered non-conductive through application of electrically insulating materials. It should be noted that radial space may be conserved by using each cooling layer to cool several coil layers.

The next three layers of the example integrated magnet device, 725a, 725b and 725c form the primary magnets layer 725 for gradient coils 120 for producing gradients along the X, Z and Y directions respectively. The order of placement of the orthogonal portions of the gradient coils 120 is not limiting and can be varied. For example, in variations the primary gradient magnets for producing a gradient along the Z-axis can be placed at 725a, the magnets for producing a gradient along the Y-axis can be placed at 725b and the magnets for producing a gradient along the X-axis can be placed at 725c. The magnets can be formed from windings that can be made of electrically conductive materials suitable for magnetic field generation such as copper. The electrically conductive materials used are typically insulated to prevent short circuits within the windings as well as with other nearby electrically conductive components. The primary magnets of the gradient coils 120 are typically placed in and/or on thermally conductive substrates such as epoxy. In variations, one or more of the primary magnets may be placed in and/or on a rigid or semi-rigid substrate to increase mechanical stability of the layers. For example, in some variations, potting epoxy may be used to form a mechanically stable structure filling all voids between and around the primary windings of the gradient coils 120. The epoxy substrate should be thermally conductive in order to efficiently transfer the heat from the primary gradient windings to the coolant layer. In some implementations, at least one of the substrates for the three layers may not be thermally conductive, and be formed of materials such as G10 and FR4. In this example, layer 725b is formed from a thermally non-conductive substrate.

Continuing with FIG. 7, thermally conductive sub-layers 730a and 730c as well as a coolant sub-layer 730b form a second cooling layer 730. The thermally conductive sub-layers 730a and 730c can be formed of any thermally conductive materials such as copper, aluminum, steel or epoxy. The coolant sub-layer 730b may be composed of any mechanisms which would allow a coolant in the form of a liquid such as water or gas such as air to be circulated about the primary windings of the gradient coils 120 and the return layer 740, which is discussed further below. For example, hundreds of thin coolant tubes running the length of the primary gradient coils 120 may be used to circulate the liquid coolant. In a variation, the coolant tubes may run around the circumference of the primary gradient coils 120 and/or its component magnets. Typically, the coolant mechanism used to distribute a coolant in the coolant sub-layer 730b is not electrically conductive. For example, the coolant tubes may be constructed from non-conductive material, or may be rendered non-conductive through application of insulating materials. The direction of coolant flow may vary from that of the coolant layer 715. It should be noted that radial space may be conserved by using each cooling layer to cool several magnet or coil layers.

At 740, a layer for return wires and/or return cooling lines is indicated. The return wires allow the output current from the field-shifting coils 140 and gradient coils 120 to their respective power supplies to be on the same side of the coil system as the input current. These wires are not actively involved in the production of magnetic fields used for scanning. The wires are typically embedded in and/or on a thermally conductive substrate such as potting epoxy. Return cooling lines allow the outlet of the cooling system to be on the same side of the coil system as the inlet of the cooling system. In some implementations, the return wires and/or the return cooling lines may be arranged in such a way that they do not pass through the space provided by layer 740. In such a variation, the return wire and/or return cooling lines could be placed within other layers of the integrated magnet device or outside the integrated magnet device.

The next three layers of the example integrated magnet device, 750a, 750b and 750c include the shield magnets for gradient coils 120 for producing shields along the X, Z and Y axis respectively. The order of placement of the directional portions of the gradient coils 120 is not limiting and can be varied. For example, in variations the shield windings for producing a shield along the Z-axis can be placed at 750a, the windings for producing a shield along the Y-axis can be placed at 750b and the windings for producing a shield along the X-axis can be placed at 750c. Typically, the order can be matched to the order of the primary magnets of the gradient coils 120 in layers 725a through 725c. The shield magnets for gradient coils 120 can be formed of windings that can be made from electrically conductive materials suitable for magnetic field generation such as copper. The electrically conductive materials used are typically insulated to prevent short circuits within the windings as well as with other nearby electrically conductive components. The shield magnets of the gradient coils 120 are typically placed in and/or on thermally conductive substrates such as epoxy. In variations, one or more of the primary windings may be placed in and/or on a rigid or semi-rigid substrate to increase mechanical stability of the layers. In some implementations, at least one of the substrates for the three layers may not be thermally conductive, and be formed of materials such as G10, FR4 or epoxy. In this example, layer 750b is formed from a thermally non-conductive substrate.

Continuing with FIG. 7, thermally conductive sub-layers 760a and 760c as well as a coolant sub-layer 760b form the third cooling layer 760. The thermally conductive sub-layers 760a and 760c can be formed of any thermally conductive materials such as copper, aluminum, steel or epoxy. The coolant sub-layer 760b may be composed of any mechanisms which would allow a coolant in the form of a liquid such as water or a glycol mixture or gas such as air to be circulated about the shield magnets of the gradient coils 120 and the shield magnets of the field-shifting electromagnet 140 layer 770. For example, hundreds of thin coolant tubes running the length of the shield magnets of the gradient coils 120 may be used to circulate the liquid coolant. In a variation, the coolant tubes may run around the circumference of the primary gradient coils 120. Typically, the coolant mechanism used to distribute a coolant in the coolant sub-layer 760b is not electrically conductive. For example, the coolant tubes may be constructed from non-conductive material, or may be rendered non-conductive through application of insulating materials. The direction of coolant flow may vary from that of coolant layer 715 and/or 730. It should be noted that radial space may be conserved by using each cooling layer to cool several coil layers.

Shield magnets of the field shifting electromagnet 140 are indicated at 770. The field-shifting shield magnet layer 770 can be placed on and/or in a substrate such as G10, FR4 or epoxy and form an electromagnet that produces the shield for the field shifting magnet field when activated. The field-shifting shield windings can be made from electrically conductive materials suitable for magnetic field generation such as copper. The electrically conductive materials used are typically insulated to prevent short circuits within the windings as well as with other nearby electrically conductive components.

In variations, one or more layers of the integrated magnet device 600 may be omitted and/or varied and/or additional layers may be added. For example, although the three cooling layers are indicated as being formed from substantially the same mechanism for cooling having substantially the same components, in variations, one or more of the three cooling layers 715, 730 and/or 760 can use different cooling mechanisms, sub-layers and/or components from each other. As a further example, in some implementations, in addition to or in place of the cooling layers, other methods of cooling more suitable for a larger DREMR system 100, such as one for human scale applications, can be used. For example, in some implementations, hollow coolant-carrying conductors can be used to implement the field-shifting electromagnets 140 and/or gradient coils 120, including the shield windings, and coolant fluids can be circulated through the hollow conductors. As a further example, additional layers of field-shifting electromagnet conductors, gradient coil conductors or other electromagnet conductors may be inserted within the assembly. In some variations the substrates in which the magnets are placed may be hold-offs spaced around the circumference of the magnet to hold the wire for some of the electromagnets. In further variations, the hold-offs may be printed using a three dimensional printer.

The integrated magnet device 600 can be used for DREMR systems 100 of a wide range of geometries and sizes. For example, DREMR system 100 can be constructed using the integrated magnet device in appropriate sizes and shapes to accommodate human-scale imaging applications, such as brain imaging applications for scanning the brain, or for small animal scanning applications. In some implementations, the relative radial positions or ordering of the windings in the integrated magnet device 600, including the shield magnets for field-shifting electromagnets 140 and the gradient coils 120, can remain the same regardless of the size of the DREMR system 100.

In other implementations where larger size DREMR systems are constructed using the integrated magnet device, the cooling methods and mechanisms used may be varied. For example, hollow conductors for the electromagnet windings can be used to provide coolant flow that is placed closer to the heat source. Accordingly, coolant fluid, whether liquid or gas, would flow through the hollow conductors of the windings forming the magnets, in place of or in addition to the coolant layers of the integrated magnet device. For example, hollow conductors can run in a loop, a spiral or helix around a radius of the integrated magnet device to implement the longitudinal (z-axis) gradient electromagnet of the gradient coils 120 and a transverse (x-axis or y-axis) gradient wire pattern can be placed in thermal contact with the z layer that contains the coolant flow. The same method can be utilized to cool the windings of field-shifting electromagnets 140, which can be similar to the z-gradient windings in that they run in loops, a spiral or a helix around a radius of the integrated magnet device. In a variation, the transverse (x-axis or y-axis) gradient electromagnet could also be formed of hollow conductors through which coolant fluid, whether liquid or gas, would flow.

Based on the intended applications of the DREMR system 100, the patterns used to implement windings of the field-shifting electromagnets 140 and the gradient coils 120 may vary. For example, different winding patterns may be used to implement the field-shifting electromagnets 140 and the gradient coils 120 to implement an integrated magnet device for use in a human-scale DREMR system 100 intended for scanning brains, in comparison to that which is intended for use in scanning small animals. The relative radial ordering of the windings used to implement the field-shifting electromagnets 140 and gradient coils 120, including the shield windings, in the integrated magnet device may remain the same. However, for a DREMR system 100 intended for brain scanning, the winding patterns for the field-shifting electromagnets 140 and the gradient coils 120 may not be symmetric along the longitudinal z-axis because a head might not be able to be placed in the center of the magnet due to geometric constraints. In contrast, the winding patterns for the field-shifting electromagnets 140 and the gradient coils 120 for a DREMR system 100 intended for small animal imaging may be longitudinally symmetric because the imaging region can be in the center of the coil.

In further variations, the primary field-shifting magnets 710 may be formed as a physically separate insert from the integrated magnet device 600. Accordingly, in some variations, the integrated magnet device 600 may remain in an MRI system continuously while the primary field shifting magnets 710 may be inserted into and removed from the integrated magnet device 600. When the primary field-shifting magnets 710 are removed, the field-shifting shield magnet layer 770 can be deactivated, by withholding current, in effect converting the DREMR system 100 into a standard MR imaging system in operation. On the other hand, when the primary field-shifting magnets 710 inset is inserted within the integrated magnet device 600, the field-shifting shield magnet layer 770 can be activated through the provision of current, in effect converting the imaging system into a DREMR system.

Such an arrangement provides several advantages. An end user can set up a non-DREMR enabled system initially and then add the primary field-shifting magnets 710 insert at a later date. The process of adding the primary field-shifting magnets 710 insert is simpler than when a non-DREMR enabled gradient coil is to be removed and replaced with a different DREMR enabled gradient coil. The end user could also switch back and forth between the choice of DREMR capability with a smaller imaging volume and no DREMR capability with a larger imaging volume (since the insert is removed) as the end user's needs change.

In this insert based arrangement, the field-shifting shield magnet layer 770 can be ordered at any desired radial location, such as between the shield gradient coils layer 750 and primary gradient coils layer 725. Furthermore, in some implementations, the elements of the integrated magnet device may not form an integrated device, but may form separate components. Moreover, primary field-shifting magnets 710 insert may include a cooling layer and a substrate layer.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A gradient coil arrangement comprising:
   an integrated magnet device for use in an magnetic resonance imaging (MRI) system comprising:
   field-shifting shield magnets;
   gradient coils comprising primary gradient magnets and shield gradient magnets, the primary gradient magnets being placed closer to an object to be imaged than the shield gradient magnets;
   at least one substrate layer providing mechanical support for the field-shifting shield magnets and the gradient coils;
   at least one cooling mechanism; and
   a removable insert placed within the integrated magnet device, the removable insert including primary field-shifting magnets physically separated from said field-shifting shield magnets, whereby the field-shifting shield magnets reduce the magnetic field produced by the removable primary field-shifting magnets outside of the radius of the field-shifting shield magnets, such that when the removable insert is removed from the integrated magnet device the field-shifting shield magnets are deactivated by withholding current and when the removable insert is placed within the integrated magnet device the field-shifting shield magnets are activated through the provision of current.

2. The gradient coil arrangement of claim 1 wherein the cooling mechanism comprises at least one of the gradient coils and the field-shifting shield magnets being in part formed from hollow conductors for receiving coolant.

3. The gradient coil arrangement of claim 1 wherein the cooling mechanism comprises:
   a coolant layer placed adjacent to at least one of the gradient coils and the field-shifting shield magnets.

4. The gradient coil arrangement of claim 3 wherein the coolant layer further comprises:
   a coolant sub-layer;
   at least one thermally conductive sub-layer placed between the coolant sub-layer and one of the gradient coils and the field-shifting shield magnets.

5. The gradient coil arrangement of claim 4 wherein the coolant sub-layer includes a mechanism allowing a coolant to be circulated.

6. The gradient coil arrangement of claim 1 wherein the integrated magnet device is cylindrical, an inside of the cylinder forming an imaging volume and the gradient coils and the field-shifting shield magnets forming circular layers of the cylinder running along the length of the cylinder, and wherein the removable insert can be inserted into the imaging volume.

7. The gradient coil arrangement of claim 6 wherein when the removable insert is not present in the imaging volume, the field-shifting shield magnets are inactive.

8. The gradient coil arrangement of claim 6 wherein each of the layers are separated by a coolant layer.

9. The gradient coil arrangement of claim 1 wherein the removable insert further comprises at least one of a coolant layer and a substrate layer.

10. A delta relaxation magnetic resonance imaging (DREMR) system comprising:
    a main field magnet generating a main magnetic field at an imaging volume;

field-shifting shield magnets placed within the bore of the main magnet;

gradient coils placed within the bore of the main magnet, said gradient coils comprising primary gradient magnets and shield gradient magnets, the primary gradient magnets being placed closer to an object to be imaged than the shield gradient magnets;

at least one substrate layer providing mechanical support for the field-shifting shield magnets and the gradient coils;

at least one cooling mechanism; and a removable insert placed within the gradient coils and the field shifting shield magnets, the removable insert including primary field-shifting magnets physically separated from said field-shifting shield magnets, whereby the field-shifting shield magnets reduce the magnetic field produced by the removable primary field-shifting magnets outside of the radius of the field-shifting shield magnets, such that when the removable insert is removed from within the gradient coils and the field shifting shield magnets the field-shifting shield magnets are deactivated by withholding current and when the removable insert is placed within the gradient coils and the field shifting shield magnets the field-shifting shield magnets are activated through the provision of current.

11. The DREMR system of claim 10 wherein the cooling mechanism comprises at least one of the gradient coils and the field-shifting shield magnets formed in part from hollow conductors for receiving coolant.

12. The DREMR system of claim 10 wherein the cooling mechanism comprises:
a coolant layer placed adjacent to at least one of the gradient coils and the field-shifting shield magnets.

13. The DREMR system of claim 12 wherein the coolant layer further comprises:
a coolant sub-layer;
at least one thermally conductive sub-layer placed between the coolant sub-layer and one of the gradient coils and the field-shifting shield magnets.

14. The DREMR system of claim 12 wherein the coolant sub-layer includes a mechanism allowing a coolant to be circulated.

15. The DREMR system of claim 10 wherein the gradient coils and the field-shifting shield magnets are cylindrical forming circular layers of an integrated device running along the length of the cylinder, and wherein the removable insert can be inserted into the imaging volume within the integrated device.

16. The DREMR system of claim 10 wherein when the removable insert is removed from within the gradient coils, the field-shifting shield magnets are inactive.

17. The DREMR system of claim 15 wherein each of the layers are separated by a coolant layer.

18. The DREMR system of claim 10 wherein the removable insert further comprises at least one of a coolant layer and a substrate layer.

* * * * *